United States Patent [19]
Semi

[11] Patent Number: 5,875,139
[45] Date of Patent: Feb. 23, 1999

[54] BITLINE PRECHARGE CIRCUIT FOR SEMICONDUCTOR MEMORY DEVICE

[75] Inventor: Atsushi Semi, Matsubara, Japan

[73] Assignee: Sharp Kabushiki Kaisha, Osaka, Japan

[21] Appl. No.: 886,342

[22] Filed: Jul. 1, 1997

[30] Foreign Application Priority Data

Oct. 3, 1996 [JP] Japan ................................. 8-263315

[51] Int. Cl.$^6$ .................................................. G11C 7/00
[52] U.S. Cl. ................ 365/203; 365/189.06; 365/189.11
[58] Field of Search ............................. 365/203, 189.06, 365/189.11

[56] References Cited

U.S. PATENT DOCUMENTS

| | | | |
|---|---|---|---|
| 4,933,905 | 6/1990 | Ootani | 365/189.06 |
| 4,985,864 | 1/1991 | Price | 365/203 |
| 5,268,874 | 12/1993 | Yamauchi | 365/189.06 |
| 5,467,312 | 11/1995 | Albon et al. | 365/203 |

FOREIGN PATENT DOCUMENTS 63-161594  7/1988  Japan .
6-60665    3/1994  Japan .

*Primary Examiner*—Son T. Dinh
*Attorney, Agent, or Firm*—Morrison & Foerster, LLP

[57] ABSTRACT

According to the present invention, a bitline precharge circuit for a semiconductor memory device is provided. The semiconductor memory device includes: a plurality of word lines arranged in a row direction; a plurality of bitlines forming a plurality of bitline pairs arranged in a column direction; and a plurality of memory cells connected between each of the plurality of bitline pairs via a plurality of switching elements, the switching elements being controlled by respectively different ones of the word lines. The bitline precharge circuit charges a potential on all of the bitlines to a precharge level which is approximately intermediate between a power supply voltage and a ground voltage before a write operation or a read operation is performed and is characterized by including a write precharge circuit for further varying the potential on the bitlines, which has been charged to the precharge level, by a predetermined level before the write operation is performed.

17 Claims, 9 Drawing Sheets

BITLINE PRECHARGE CIRCUIT FOR SEMICONDUCTOR MEMORY DEVICE

BACKGROUND OF THE INVENTION

1. Field of the Invention:

The present invention relates to a bitline precharge circuit for a semiconductor memory device, and more particularly relates to a bitline precharge circuit for precharging the bitlines connected to memory cells arranged in matrix.

2. Description of the Related Art:

An exemplary configuration of a conventional SRAM (static random access memory) is shown in FIG. 10. In this SRAM, multiple word lines WL and multiple bitline pairs BIT and /BIT are arranged in the row direction and the column direction, respectively. The same number of memory cells MRC as the number of the rows are connected to each bitline pair BIT and /BIT associated with each column Col. These memory cells MRC connected to a bitline pair BIT and /BIT on an identical column Col are connected to respectively different word lines WL, while the memory cells MRC which are connected to bitline pairs BIT and /BIT on different columns Col and disposed on the row are connected to one and the same word line WL. For the sake of simplifying the description, it should be noted that FIG. 10 illustrates only two word lines $WL_1$ and $WL_2$ corresponding to two rows, only two bitline pairs $BIT_1$ & $/BIT_1$ and $BIT_2$ & $/BIT_2$ corresponding to two columns $Col_1$ and $Col_2$, only two memory cells $MRC_1$ and $MRC_2$ connected to the bitline pair $BIT_1$ and $/BIT_1$ on the first column $Col_1$ and only two memory cells $MRC_3$ and $MRC_4$ connected to the bitline pair $BIT_2$ and $/BIT_2$ on the second column $Col_2$. As shown in FIG. 10, the memory cells $MRC_1$ and $MRC_3$ on the same row are connected to the same word line $WL_1$ and the memory cells $MRC_2$ and $MRC_4$ on the same row are connected to the same word line $WL_2$.

The pair of bitlines $BIT_1$ and $/BIT_1$ on the first column $Col_1$ are connected to data lines $D_1$ and $/D_1$, respectively, via associated column selector circuits 3 on the first column $Col_1$, while the pair of bitlines $BIT_2$ and $/BIT_2$ on the second column $Col_2$ are connected to data lines $D_2$ and $/D_2$, respectively, via associated column selector circuits 3 on the second column $Col_2$. Each of the column selector circuits 3 is a circuit for connecting the bitlines BIT and /BIT to the data lines $D_1$ and $/D_1$ or $D_2$ and $/D_2$ via a single N-MOSFET (N-channel metaloxide-semiconductor field effect transistor) $N_{11}$, the ON/OFF states of which are controlled by a column select signal Y. It is noted that the column select signal Y is a control signal for selecting a specified column Col and that different column select signals Y are used for the respective columns Col. Specifically, the pair of column selector circuits 3 on the first column $Col_1$ are controlled by a column select signal $Y_1$ on the same first column $Col_1$, while the pair of column selector circuits 3 on the second column $Col_2$ are controlled by a column select signal $Y_2$ on the same second column $Col_2$. Herein, the data line pair $D_1$ and $/D_1$ are connected to the bitline pair $BIT_1$ and $/BIT_1$ adjacent thereto and the data line pair $D_2$ and $/D_2$ are connected to the bitline pair $BIT_2$ and $/BIT_2$ adjacent thereto.

The bitline pair $BIT_1$ and $/BIT_1$ on the first column $Col_1$ are connected to a power supply $V_{cc}$ via associated bitline precharge circuits 1 on the first column $Col_1$, while the bitline pair $BIT_2$ and $/BIT_2$ on the second column $Col_2$ are connected to the power supply $V_{cc}$ via associated bitline precharge circuits 1 on the second column $Col_2$. Each of the bitline precharge circuits 1 is constituted by a single NMOS transistor $N_1$ shown in FIG. 11, in which the drain D thereof is connected to the power supply $V_{cc}$, the source S thereof is connected to the associated bitline BIT or /BIT and a precharge signal $EQ_0$ is input to the gate G thereof. Thus, each bitline precharge circuit 1 connects the bitline BIT or /BIT to the power supply $V_{cc}$ when the precharge signal $EQ_0$ is at an H level (equal to the level of the power supply voltage $V_{cc}$). Moreover, as shown in FIG. 10, a pair of bitlines BIT and /BIT on each column Col are connected to each other via an NMOS transistor $N_{12}$, the ON/OFF states of which are controlled by the precharge signal $EQ_0$. It is noted that the precharge signal $EQ_0$ is a control signal commonly used among the respective columns Col.

In the SRAM having such a configuration, during a precharge period before a write operation or a read operation is performed, the precharge signal $EQ_0$ rises to the H level, thereby connecting all the bitline pairs BIT and /BIT to the power supply $V_{cc}$ via the NMOS transistors $N_1$ of the bitline precharge circuits 1. However, since the ON state of the NMOS transistor $N_1$ cannot be maintained unless the potential difference between the gate G and the source S thereof is equal to or larger than a threshold voltage Vth, the potential on the bitline pair BIT and /BIT can only be charged up to a voltage which is lower than the power supply voltage $V_{cc}$ by the threshold voltage Vth and which becomes a precharge level. This NMOS transistor $N_1$ has a high threshold voltage Vth because of the influence of a substrate bias and the like. For example, assuming that the power supply voltage $V_{cc}$ is 4 V, the threshold voltage Vth becomes about 1.5 V. Thus, the precharge level becomes equal to about 2.5 V, which is an approximately intermediate voltage between the power supply voltage $V_{cc}$ of 4 V and the voltage of a ground GND of 0 V. Furthermore, when the precharge signal $EQ_0$ rises to the H level, a pair of bitlines BIT and /BIT on each column Col are connected to each other via the NMOS transistor $N_{12}$ so that the voltages or the precharge levels of the bitlines BIT and /BIT are equalized.

It is noted that the terms "power supply" and "ground" mean a pair of powers having such a relationship that the potential difference obtained by subtracting the ground voltage from the power supply voltage always becomes positive.

When the precharging of all the bitlines BIT and /BIT is completed in the above-described manner, a row is selected by activating any of the word lines WL (setting the word line WL at the H level, for example) and at the same time, a column Col is selected by setting any of the column select signals Y at the H level, thereby writing the data input to a pair of data lines $D_1$ and $/D_1$ or $D_2$ and $/D_2$ to the memory cell MRC on the selected row via the pair of bitlines BIT and /BIT on the selected column Col or outputting the data read out from the memory cell MRC through the pair of data lines $D_1$ and $/D_1$ or $D_2$ and $/D_2$ via the pair of bitlines BIT and /BIT.

On the other hand, if any of the word lines WL is activated during such a write operation or read operation, the memory cells MRC on all the columns Col which are disposed on the row corresponding to the activated word line WL are connected to the associated bitline pairs BIT and /BIT. Thus, if data which has been written or read during a previous write or read operation remains on these bitlines BIT and /BIT, then it takes a long time to read out the data stored in the memory cells MRC, or in some cases, the data may be possibly destroyed. Thus, before the write operation or the read operation is performed, all the bitlines BIT and /BIT are required to be precharged to the precharge level intermediate between the power supply voltage $V_{cc}$ and the ground voltage GND by using the bitline precharge circuits 1.

However, as shown in FIG. 10, a parasitic capacitance C is generated between the bitline /BIT$_1$ on the first column Col$_1$ and the bitline BIT$_2$ on the second column Col$_2$ which are adjacent to each other, for example. Thus, when the potential of the bitline /BIT$_1$ on the selected column Col$_1$ is abruptly varied by the input of data during a write operation, the precharge level on the non-selected bitline BIT$_2$ adjacent to the bit-line /BIT$_1$ is sometimes varied considerably, owing to a coupling (or an electrostatic induction) caused by the parasitic capacitance C. As the gap between adjacent bitlines BIT and /BIT becomes finer for fulfilling the requirements of downsizing a chip and increasing the storage capacity, the parasitic capacitance C generated therebetween increases correspondingly. As a result, the influence of the coupling is also increased. However, during a read operation, since the potential on the bitline BIT$_1$ is slightly varied, the influence of the coupling is relatively small.

In this case, if a memory cell MRC is of a C-MOS (complementary MOS) type, a bitline pair BIT and /BIT can be rapidly charged from such a memory cell MRC. Thus, the potential variation on a non-selected bitline BIT or /BIT resulting from the coupling caused by the parasitic capacitance C is substantially negligible. However, in the SRAM, in order to downsize a chip and improve the response characteristics thereof, a memory cell MRC of a high-resistance pull-up type or a high-resistance pull-down type is often used.

As shown in FIG. 12, a high-resistance pull-up type memory cell MRC includes two NMOS transistors N$_{21}$, and N$_{22}$. The drains D of the NMOS transistors N$_{21}$ and N$_{22}$ are connected to a power supply V$_{cc}$ via high resistances R$_1$ and R$_2$, respectively. The sources S of the NMOS transistors N$_{21}$ and N$_{22}$ are connected to a ground GND. And the gates G of the NMOS transistors N$_{21}$ and N$_{22}$ are connected to the drains D of the other NMOS transistors N$_{22}$ and N$_{21}$, respectively. The drains D of these NMOS transistors N$_{21}$ and N$_{22}$ are also connected to a pair of bitlines BIT and /BIT via NMOS transistors N$_{23}$ and N$_{24}$ or switching elements (the gates of which are connected to a word line WL), respectively. Thus, in this high-resistance pull-up type memory cell MRC, in the situation where the word line WL rises to the H level and whereby the NMOS transistors N$_{23}$ and N$_{24}$ are turned ON, if the potential on a bitline BIT is too low, then it takes a long time to charge the bitline BIT from the power supply V$_{cc}$ via the high resistance R$_1$, even when the drain D of the NMOS transistor N$_{21}$ holds an H level state, for example. As a result, in the meantime, the potential of the gate G of the NMOS transistor N$_{22}$ may become low so that the NMOS transistor N$_{22}$ may be inverted from ON into OFF. Consequently, the data stored in the NMOS transistor N$_{22}$ is possibly destroyed. In other words, in the case of using such a high-resistance pull-up type memory cell MRC, if the potential on a non-selected bitline BIT or /BIT becomes low because of the coupling caused by the parasitic capacitance C, then the data stored therein is more likely to be destroyed.

In the configuration shown in FIG. 10, assuming that the potential variation on a selected bitline /BIT$_1$ is denoted by ΔVb1 and the parasitic grounded capacitance of the bitline BIT$_2$ adjacent to the bitline /BIT$_1$ is denoted by Cb2 (C is a parasitic capacitance therebetween), the potential variation ΔVb2 on the bitline BIT$_2$ can be represented as:

$$\Delta Vb2 = \Delta Vb1 \cdot C/Cb2$$

In addition, assuming that the inversion potential of the high-resistance pull-up type memory cell MRC shown in FIG. 12 is denoted by Vm, the potential V on the adjacent non-selected bitline BIT$_2$ is required to satisfy the following relationship:

$$V > Vm + \Delta Vb2$$

Thus, during a write operation, when the word line WL$_1$ and the column select signal Y$_1$ rise to the H level and the input of data to the bitline /BIT$_1$ largely lowers the potential on the bitline /BIT$_1$, for example, the potential V on the non-selected bitline BIT$_2$ adjacent to the bitline /BIT$_1$ is also lowered because of the coupling. Thus, if the potential V on the bitline BIT$_2$ becomes equal to or lower than Vm+ΔVb2, then the data stored in the memory cell MRC$_3$ is destroyed.

For example, assume a case shown in FIG. 13. As shown in FIG. 13, when the precharging is completed at a time t$_{11}$ by the fall of the precharge signal EQ$_0$ to the L level (i.e., the voltage level of the ground GND=0 V), the potential on a selected bitline pair BIT$_1$ and /BIT$_1$ has reached a normal precharge level or the voltage V$_2$ (about 2.4 V), whereas the potential on a nonselected bitline pair BIT$_2$ and /BIT$_2$ has reached only the voltage V$_1$ (about 2.25 V) lower than the voltage V$_2$ because of the influence of the previous access. When the word line WL$_1$ rises to the H level at a time t$_{12}$, the potential on one /BIT$_1$ of the selected bitline pair once increases because of the influence of the previous access and then decreases considerably to the vicinity of 0 V.

In such a case, the potential on one BIT$_2$ of the non-selected bitline pair which is adjacent to the bitline /BIT$_1$ also increases slightly once, and then decreases considerably. Consequently, at a time t$_{13}$, the voltage levels at internal nodes ND$_1$ and ND$_2$ of the memory cell MRC$_3$ are inverted so that the data stored therein is destroyed.

On the other hand, a high-resistance pull-down type memory cell MRC includes two PMOS transistors (or P-channel MOSFETs) P$_{21}$ and P$_{22}$, as shown in FIG. 14. The sources S of the PMOS transistors P$_{21}$ and P$_{22}$ are connected to a power supply V$_{cc}$. The drains D of the PMOS transistors P$_{21}$ and P$_{22}$ are connected to a ground GND via high resistances R$_1$ and R$_2$, respectively. And the gates G of the PMOS transistors P$_{21}$ and P$_{22}$ are connected to the drains D of the other PMOS transistors P$_{22}$ and P$_{21}$, respectively. The drains D of these PMOS transistors P$_{21}$ and P$_{22}$ are also connected to bitlines BIT and /BIT via NMOS transistors N$_{23}$ and N$_{24}$ (the gates of which are connected to a word line WL), respectively. Thus, in this high-resistance pull-down type memory cell MRC, in the situation where the word line WL rises to the H level and whereby the NMOS transistors N$_{23}$ and N$_{24}$ are turned ON, if the potential on a bitline BIT is too high, then it takes a long time to discharge from the bitline BIT to the ground GND via the high resistance R$_1$, even when the drain D of the PMOS transistor P$_{21}$ holds an L level state, for example. As a result, in the meantime, the potential on the gate G of the PMOS transistor P$_{22}$ may increase so that the PMOS transistor P$_{22}$ may be inverted from ON into OFF. Consequently, the data stored in the PMOS transistor P$_{22}$ is possibly destroyed. In other words, in the case of using such a high-resistance pull-down type memory cell MRC, if the potential on a non-selected bitline BIT or /BIT increases because of the coupling caused by the parasitic capacitance C, then the data stored therein is more likely to be destroyed.

Thus, in a conventional SRAM, if the potential on a selected bitline pair BIT and /BIT is largely varied by the input of data, then the potential precharged on an adjacent bitline pair BIT and /BIT is also varied because of the coupling caused by the parasitic capacitance C. Consequently, such an SRAM has problem in that the data stored in a non-selected memory cell MRC on the adjacent bitline pair BIT and /BIT is possibly destroyed.

In order to solve such a problem, it has conventionally been proposed to provide electrostatic shielding wires, to which the ground GND is always connected, between two adjacent bitlines BIT and /BIT. However, in order to provide such electrostatic shielding wires, the gap between adjacently disposed bitlines BIT and /BIT must be widened. As a result, a new problem is caused in that it becomes difficult to fulfill the requirement of downsizing a chip.

SUMMARY OF THE INVENTION

According to the present invention, a bitline precharge circuit for a semiconductor memory device is provided. The semiconductor memory device includes: a plurality of word lines arranged in a row direction; a plurality of bitlines forming a plurality of bitline pairs which are arranged in a column direction; and a plurality of memory cells connected between each of the plurality of bitline pairs via a plurality of switching elements, the switching elements being controlled by respectively different ones of the word lines. The bitline precharge circuit charges a potential on all of the bitlines to a precharge level which is approximately intermediate between a power supply voltage and a ground voltage before a write operation or a read operation is performed. The bitline precharge circuit is characterized by including a write precharge circuit for further varying the potential on the bitlines, which has been charged to the precharge level, by a predetermined level before the write operation is performed.

In one embodiment, the write precharge circuit further varies the potential on the bitlines, which has been charged to the precharge level, to a higher potential by the predetermined level.

In another embodiment, the write precharge circuit further varies the potential on the bitlines, which has been charged to the precharge level, to a lower potential by the predetermined level.

In still another embodiment, each of the memory cell is an SRAM memory cell of a high-resistance pull-up type which includes a first and a second NMOS transistor and in which drains of the first and second NMOS transistors are connected to a power supply via respective high resistances, sources of the first and second NMOS transistors are grounded and gates of the first and second NMOS transistors are connected to the drain of the second NMOS transistor and the drain of the first NMOS transistor, respectively.

In still another embodiment, each of the memory cell is an SRAM memory cell of a high-resistance pull-down type which includes a first and a second PMOS transistor and in which sources of the first and second PMOS transistors are connected to a power supply, drains of the first and second PMOS transistors are grounded via respective high resistances and gates of the first and second PMOS transistors are connected to the drain of the second PMOS transistor and the drain of the first PMOS transistor, respectively.

In still another embodiment, the precharge circuit includes an NMOS transistor associated with each of the bitlines and is configured such that a drain of the NMOS transistor is connected to a power supply, a source of the NMOS transistor is connected to the associated bitline and a precharge signal rising to an H level during a precharge period is input to a gate of the NMOS transistor, and the write precharge circuit includes a PMOS transistor associated with each of the bitlines and is configured such that a source of the PMOS transistor is connected to a power supply, a drain of the PMOS transistor is connected to the associated bitline and a write precharge signal, falling to an L level during a predetermined period immediately before the write operation and after the precharge period, is input to a gate of the PMOS transistor.

In still another embodiment, the PMOS transistor of the write precharge circuit is constituted by a TFT.

In still another embodiment, the precharge circuit includes a first NMOS transistor associated with each of the bitlines and is configured such that a drain of the first NMOS transistor is connected to a power supply, a source of the first NMOS transistor is connected to the associated bitline and a precharge signal rising to an H level during a precharge period is input to a gate of the first NMOS transistor, and the write precharge circuit includes a second NMOS transistor, which is associated with each of the bitlines and has a threshold voltage lower than a threshold voltage of the first NMOS transistor, and is configured such that a drain of the second NMOS transistor is connected to a power supply, a source of the second NMOS transistor is connected to the associated bitline and a write precharge signal, rising to the H level during a predetermined period immediately before the write operation and after the precharge period, is input to a gate of the second NMOS transistor.

In still another embodiment, the precharge circuit includes a PMOS transistor associated with each of the bitlines and is configured such that a source of the PMOS transistor is connected to the associated bitline, a drain of the PMOS transistor is grounded and a precharge signal falling to an L level during a precharge period is input to a gate of the PMOS transistor, and the write precharge circuit includes an NMOS transistor associated with each of the bitlines and is configured such that a drain of the NMOS transistor is connected to the associated bitline, a source of the NMOS transistor is grounded and a write precharge signal, rising to the H level during a predetermined period immediately before the write operation and after the precharge period, is input to a gate of the NMOS transistor.

In still another embodiment, the precharge circuit includes a first PMOS transistor associated with each of the bitlines and is configured such that a source of the first PMOS transistor is connected to the associated bitline, a drain of the first PMOS transistor is grounded, and a precharge signal falling to an L level during a precharge period is input to a gate of the first PMOS transistor, and the write precharge circuit includes a second PMOS transistor, which is associated with each of the bitlines and has a threshold voltage lower than a threshold voltage of the first PMOS transistor, and is configured such that a source of the second PMOS transistor is connected to the associated bitline, a drain of the second PMOS transistor is grounded, and a write precharge signal, falling to the L level during a predetermined period immediately before the write operation and after the precharge period, is input to a gate of the second PMOS transistor.

According to the present invention, during a write operation, a write precharge circuit varies the potential on a bitline into a level which has further been varied from the precharge level by a predetermined voltage. Thus, even in the case where the potential on a non-selected bitline adjacent to a bitline selected during the write operation has been varied because of an electrostatic induction, the potential variation on the non-selected bitline can be compensated for beforehand by the write precharge circuit, thereby preventing the data stored in a memory cell connected to the adjacent nonselected bitline from being destroyed.

In addition, according to the present invention, the write precharge circuit further varies the potential on a bitline into a level higher than the precharge level by a predetermined voltage. Thus, even when a memory cell of such a type that the data stored therein is likely to be destroyed by the decrease of the bitline potential is used, the data stored in a non-selected memory cell can be protected.

Moreover, according to the present invention, the write precharge circuit further varies the potential on a bitline into a level lower than the precharge level by a predetermined voltage. Thus, even when a memory cell of such a type that the data stored therein is likely to be destroyed by the increase of the bitline potential is used, the data stored in a non-selected memory cell can be protected.

Furthermore, according to the present invention, the write precharge circuit further varies the potential on a bitline into a level higher than the precharge level by a predetermined vol age. Thus, even when an SRAM memory cell of such a high-resistance pull-up type that the data stored therein is likely to be destroyed by the decrease of the bitline potential is used, the data stored in a non-selected memory cell can be protected.

Furthermore, according to the present invention, the write precharge circuit further varies the potential on a bitline into a level lower than the precharge level by a predetermined voltage. Thus, even when an SRAM cell of such a high-resistance pull-down type that the data stored therein is likely to be destroyed by the increase of the bitline potential is used, the data stored in a non-selected memory cell can be protected.

Furthermore, according to the present invention, when a precharge signal rises to the H level during a precharge period, the NMOS transistor of a precharge circuit is activated, thereby charging an associated bitline up to a voltage lower than the power supply voltage by a threshold voltage (i.e., the precharge level). In the case of performing a write operation, a write precharge signal holds an L level for a predetermined period thereafter, thereby activating the PMOS transistor of a write precharge circuit and allowing the bitline to be charged up to the power supply voltage. Thus, this bitline potential can be varied into a higher potential by a predetermined level to be determined by the predetermined period during which the write precharge signal holds the L level.

Furthermore, according to the present invention, a TFT (thin film transistor) is formed on the NMOS transistor of the precharge circuit by depositing a poly-silicon thin film or the like thereon, thereby forming a PMOS transistor for a write precharge circuit. Thus, even if such write precharge circuits are provided, it is possible to prevent the layout area from being increased.

Furthermore, according to the present invention, during the precharge period, the first NMOS transistor of a precharge circuit is activated, thereby charging an associated bitline up to a voltage lower than the power supply voltage by a first threshold voltage (i.e., the precharge level). In the case of performing a write operation, a second NMOS transistor of a write precharge circuit remains active for a predetermined period thereafter, thereby charging the bitline up to a voltage lower than the power supply voltage by a second threshold voltage. Since the second threshold voltage is lower than the first threshold voltage, the potential on the bitline can be varied into a higher potential by a difference between the first and the second threshold voltages. In addition, since the first and the second NMOS transistors can be formed on the same well, it is possible to prevent the layout area from being increased because of the division of the well.

Furthermore, according to the present invention, when a precharge signal falls to the L level during a precharge period, the PMOS transistor of a precharge circuit is activated, thereby discharging an associated bitline to a voltage higher than the ground voltage by a threshold voltage (i.e., the precharge level). In the case of performing a write operation, a write precharge signal holds an H level for a predetermined period thereafter, thereby activating the NMOS transistor of a write precharge circuit and allowing the bitline to be discharged to the ground voltage. Thus, this bitline potential can be varied into a lower potential by a predetermined level to be determined by the predetermined period during which the write precharge signal holds the H level.

Furthermore, according to the present invention, during the precharge period, the first PMOS transistor of a precharge circuit is activated, thereby discharging the associated bitline up to a voltage higher than the ground voltage by a first threshold voltage (i.e., the precharge level). In the case of performing a write operation, a second PMOS transistor of a write precharge circuit remains active for a predetermined period thereafter, thereby discharging the bitline up to a voltage higher than the ground voltage by a second threshold voltage. Thus, since the second threshold voltage is lower than the first threshold voltage, the potential on the bitline can be varied into a lower potential by a difference between the first and the second threshold voltages. In addition, since the first and the second PMOS transistors can be formed on the same well, it is possible to prevent the layout area from being increased because of the division of the well.

Thus, the invention described herein makes possible the advantage of providing a bitline precharge circuit for a semiconductor memory device which can prevent the data stored in a memory cell on a non-selected bitline from being destroyed owing to the interference of a selected bitline adjacent to the non-selected bitline by making a write precharge circuit further vary the potential level on a bitline, which has been precharged by a precharge circuit, by a predetermined amount during a write operation without any need for providing electrostatic shielding wires.

This and other advantages of the present invention will become apparent to those skilled in the art upon reading and understanding the following detailed description with reference to the accompanying figures.

DESCRIPTION OF THE PREFERRED EMBODIMENTS

Figure 1:
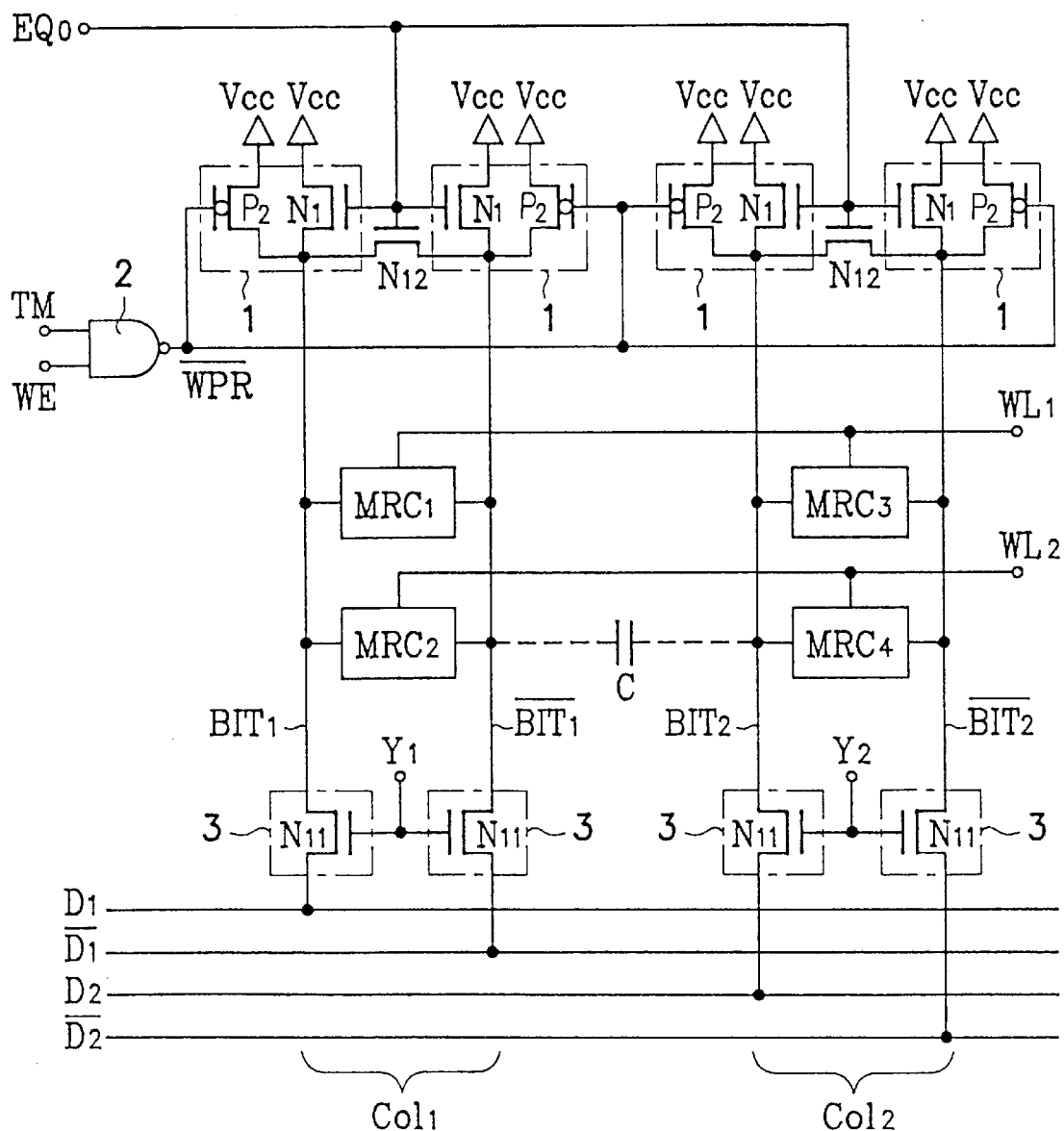
FIG. 1 is a block diagram showing a configuration of an SRAM in the first example of the present invention.

Hereinafter, the embodiments of the present invention will be described with reference to the accompanying drawings.

EXAMPLE 1

FIGS. 1 to 7 show a first example of the present invention. It is noted that the components having the same functions as the components of the conventional example shown in FIGS. 10 to 14 will be identified by the same reference numerals.

Figure 12:
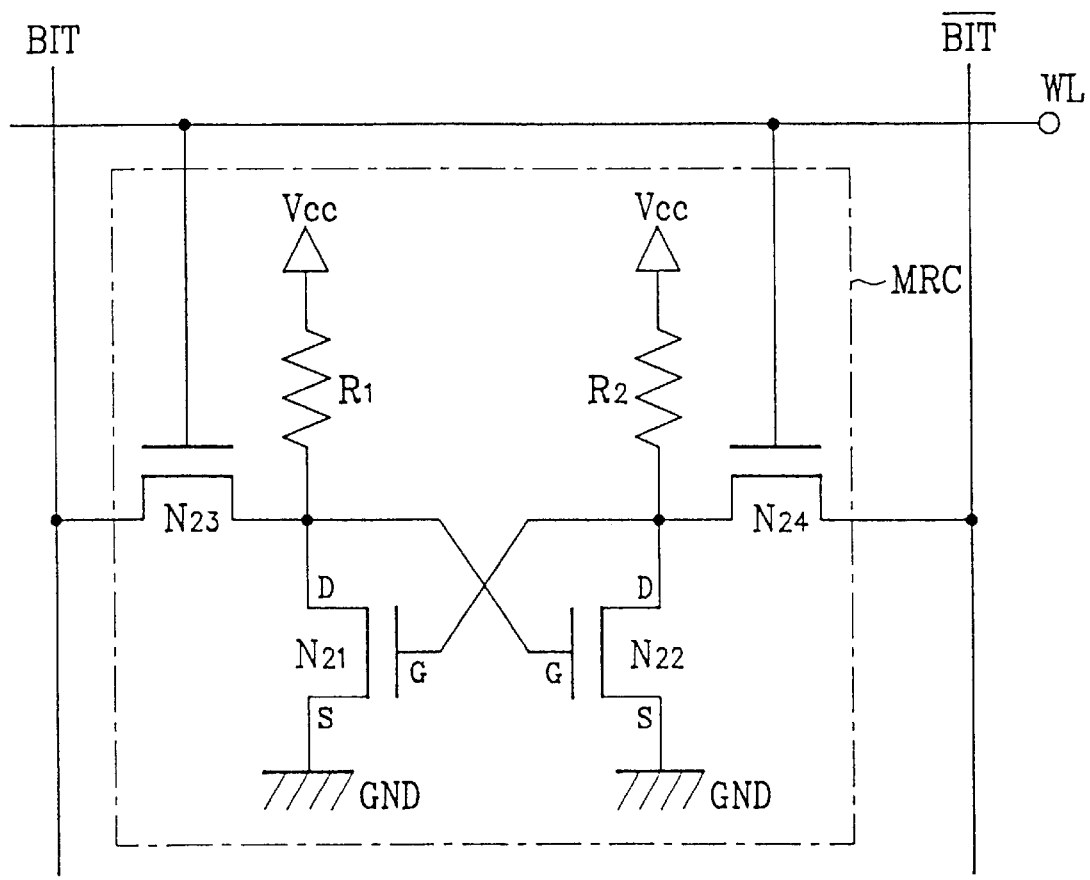
FIG. 12 is a circuit diagram showing an exemplary configuration of a conventional high-resistance pull-up type memory cell.
Figure 13:
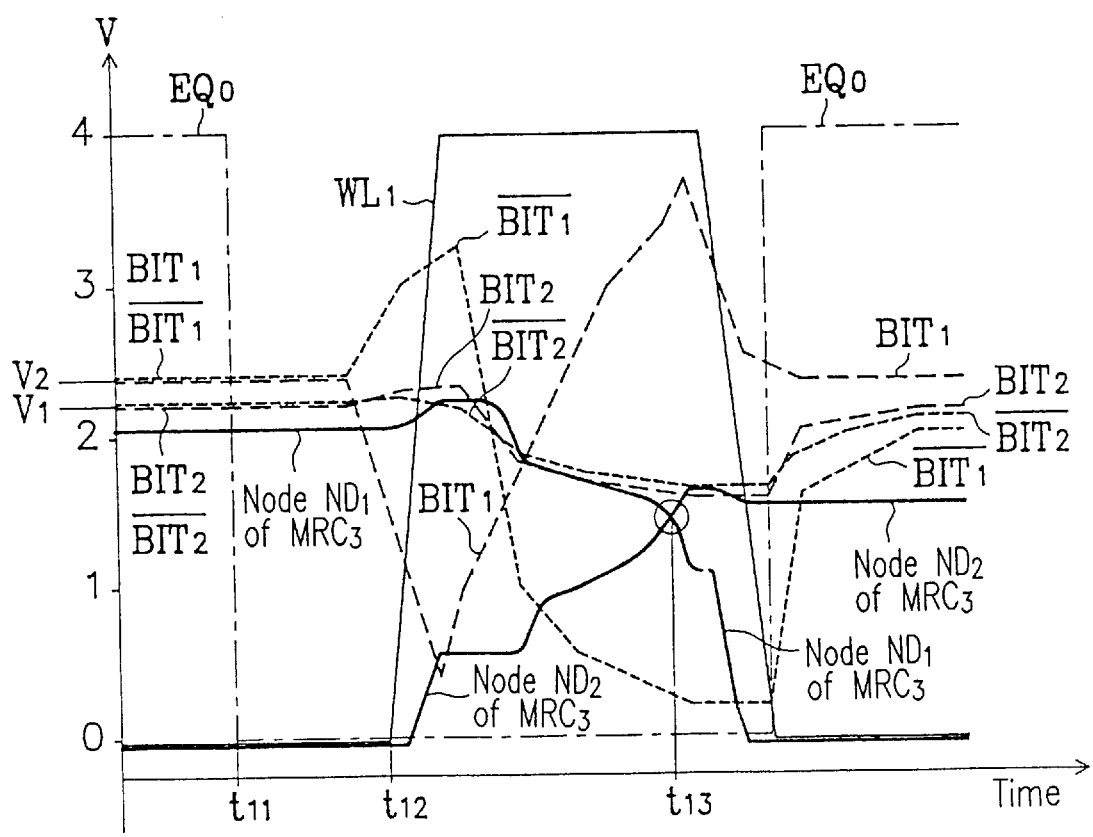
FIG. 13 is a timing diagram illustrating a write operation of the SRAM in the conventional example.

In this first example, a bitline precharge circuit for an SRAM including memory cells of the high-resistance pull-up type shown in FIG. 12 will be described. In this SRAM, as shown in FIG. 1, multiple word lines WL, multiple pairs of bitlines BIT and /BIT and multiple memory cells MRC are disposed and interconnected in the same way as in the conventional example shown in FIG. 10. Also, in the same way as in the conventional example shown in FIG. 10, a bitline pair $BIT_1$ and $/BIT_1$ on the first column $Col_1$ and a bitline pair $BIT_2$ and $/BIT_2$ on the second column $Col_2$ are connected to pairs of data lines $D_1$ & $/D_1$ and $D_2$ & $/D_2$, respectively, via the associated column selector circuits 3 and the bitlines of each pair are connected to each other via an NMOS transistor $N_{12}$. Furthermore, a parasitic capacitance C is similarly generated between adjacent bitlines BIT and /BIT, e.g., between bitlines $/BIT_1$ and $BIT_2$.

Figure 2:
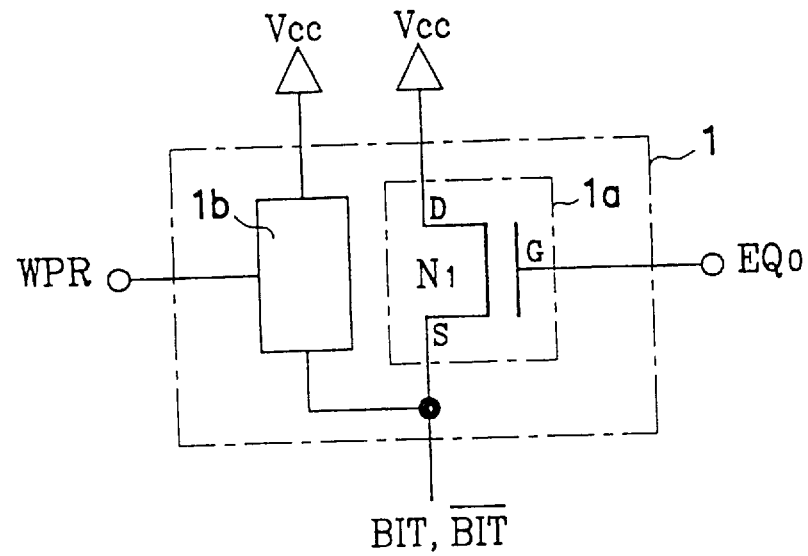
FIG. 2 is a circuit diagram showing a configuration of a bitline precharge circuit in the first example of the present invention.

The pair of bitlines $BIT_1$ and $/BIT_1$ on the first column $Col_1$ are connected to a power supply $V_{cc}$ via the associated bitline precharge circuits 1 on the first column $Col_1$, while the pair of bitlines $BIT_2$ and $/BIT_2$ on the second column $Col_2$ are connected to the power supply $V_{cc}$ via the associated bitline precharge circuits 1 on the second column $Col_2$. In each bitline precharge circuit 1, the associated bitline BIT or /BIT is connected to the power supply $V_{cc}$ via a precharge circuit 1a and a write precharge circuit 1b, as shown in FIG. 2.

Figure 11:
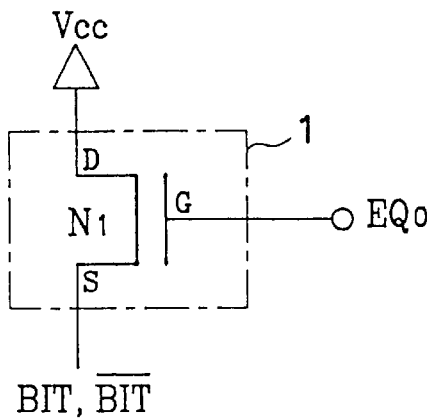
FIG. 11 is a circuit diagram showing an exemplary configuration of a bitline precharge circuit in the conventional example.

The precharge circuit 1a has the same configuration as that of the conventional bitline precharge circuit 1 shown in FIG. 11. That is to say, the precharge circuit 1a is implemented as a single NMOS transistor $N_1$ in which the drain D thereof is connected to the power supply $V_{cc}$, the source S thereof is connected to the associated bitline BIT or /BIT and a precharge signal $EQ_0$ is input to the gate G thereof.

The write precharge circuit 1b is a circuit which can charge the associated bitline BIT or /BIT to a potential higher than that of the precharge circuit 1a when a write precharge signal WPR is activated. The write precharge circuit 1b may be implemented as a single PMOS transistor $P_2$ shown in FIG. 3 in which the source S thereof is connected to the power supply $V_{cc}$, the drain D thereof is connected to the associated bitline BIT or /BIT and a write precharge signal /WPR is input to the gate G thereof. It is assumed that the exemplary bitline precharge circuit 1 shown in FIG. 1 includes the write precharge circuit 1b shown in FIG. 3.

Figure 4:
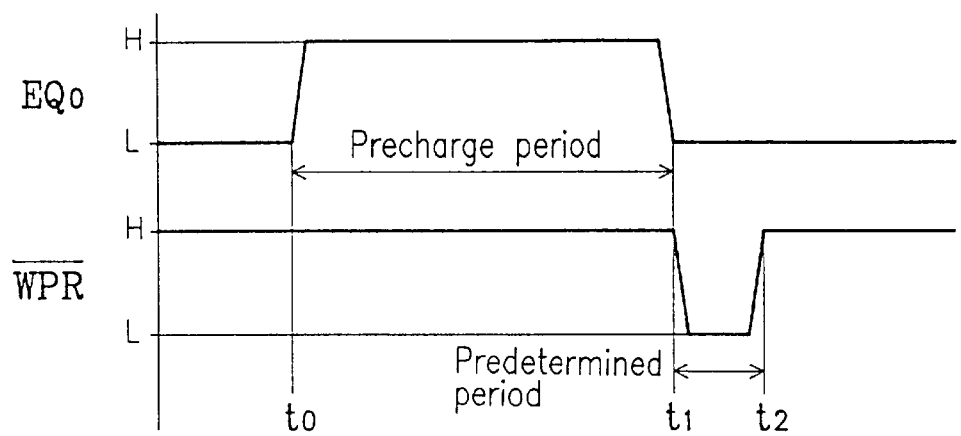
FIG. 4 is a timing diagram showing the relationship between a precharge signal $EQ_0$ and a write precharge signal /WPR in the first example of the present invention.

A precharge signal $EQ_0$ is a control signal which holds an H level (or remains active) during a precharge period between times $t_0$ and $t_1$ before a write operation or a read operation is performed, as shown in FIG. 4. When the precharge signal $EQ_0$ rises to the H level, the NMOS transistors $N_1$ constituting the precharge circuits 1a in respective bitline precharge circuit 1 are turned ON so that all the bitlines BIT and /BIT shown in FIG. 1 are connected to the power supply $V_{cc}$. It is noted that, in this case, the potential on the bitlines BIT and /BIT is charged to the precharge level lower than the power supply voltage $V_{cc}$ by the threshold voltage Vth of the NMOS transistor $N_1$, as described above. Also, when the precharge signal $EQ_0$ rises to the H level, the bitlines BIT and /BIT of each pair on each column Col are connected to each other via an NMOS transistor $N_{12}$ so that the voltages at the precharge level are equalized.

Figure 3:
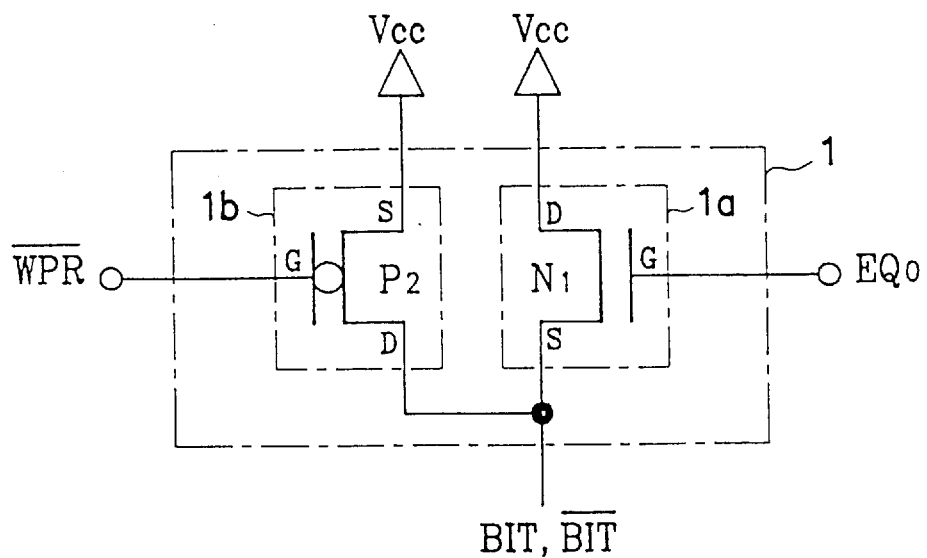
FIG. 3 is a circuit diagram showing a specific exemplary configuration of the bitline precharge circuit in the first example of the present invention.

The write precharge signal /WPR used for the write precharge circuit 1b shown in FIG. 3 is a control signal which holds an L level (or remains active) between the time $t_1$ when the precharge signal $EQ_0$ falls to the L level and a time $t_2$ which is later than the time $t_1$ by a predetermined time period and immediately before a write operation is started, only in the case of the write operation as shown in FIG. 4. Such a write precharge signal /WPR can be produced by inputting a timing signal TM and a write enable signal WE, which holds the H level for a predetermined period after the fall of the precharge signal $EQ_0$ to the L level, to a NAND gate 2 as shown in FIG. 1. That is to say, since the write enable signal WE rises to the H level (or activated) only during the write operation, the write precharge signal /WPR remains at the H level (inactive) even after the precharge period has passed in the case of a read operation. Conversely, in the case of the write operation, the write precharge signal /WPR holds the L level for a predetermined period after the precharge period has passed.

When the write precharge signal /WPR falls to the L level, the PMOS transistors $P_2$ constituting the write precharge circuits 1b in the respective bitline precharge circuits 1 are turned ON, thereby connecting all the bitlines BIT and /BIT shown in FIG. 1 to the power supply $V_{cc}$. Furthermore, in this case, since the PMOS transistors $P_2$ can hold the ON state irrespective of the potential on the bitlines BIT and /BIT, the potential on the bitlines BIT and /BIT can be charged up to the power supply voltage $V_{cc}$. However, it takes a rather long time to charge the bitlines BIT and /BIT in accordance with the current drivability of the PMOS transistors $P_2$ and the like. Thus, by adjusting the length of the predetermined period during which the write precharge signal /WPR holds the L level, the potential on the bitlines BIT and /BIT is charged to a voltage which is surely higher than the voltage charged during the precharge period but sufficiently lower than the power supply voltage $V_{cc}$. As a result, the predetermined period during which the write precharge signal /WPR holds the L level becomes a period sufficiently longer than the precharge period in actuality.

Under the above-described configuration, in the SRAM of the first example, the bitline precharge circuits 1 turn ON only the NMOS transistors $N_1$ of the respective precharge circuits 1a, thereby charging the bitlines BIT and /BIT to a normal precharge level during the read operation. However, since the potential variation on the bitlines BIT and /BIT is relatively moderate during this read operation, adjacent bit-lines BIT and /BIT are hardly affected by the coupling caused by a parasitic capacitance C. Consequently, in this case, the data stored in a memory cell MRC can be read out rapidly and surely in the same way as in a conventional example.

On the other hand, in the case of a write operation, assuming that a word line $WL_1$ and a column select signal $Y_1$ rise to the H level, for example, the potential of a bitline $/BIT_1$ on a selected column $Col_1$ is varied abruptly and considerably so that an adjacent bitline $BIT_2$ on a non-selected column $Col_2$ is significantly affected by the coupling. Furthermore, since a non-selected memory cell $MRC_3$ connected to a pair of bitlines $BIT_2$ and $/BIT_2$ on the column $Col_2$ is of a high-resistance pull-up type shown in FIG. 12, if the potential on the bitline $BIT_2$ falls because of the coupling, then the data stored in the memory cell $MRC_3$ is more likely to be destroyed. However, the bitline precharge circuit 1 of the first example turns ON the NMOS transistor $N_1$ of each precharge circuit 1a before the write operation is started, charges each pair of bitlines BIT and /BIT to the precharge level and then turns ON the PMOS transistor $P_2$ of each write precharge circuit 1b, thereby varying the potential on each pair of bitlines BIT and /BIT into a voltage higher than the precharge level by a predetermined level. Thus, even when the potential on the bitline $BIT_2$ on the column $Col_2$ becomes low because of the coupling caused by the parasitic capacitance C, this potential variation is caused at a voltage level higher than a conventional level so that it is possible to prevent the data stored in a non-selected memory cell $MRC_3$ from being destroyed.

Figure 5:
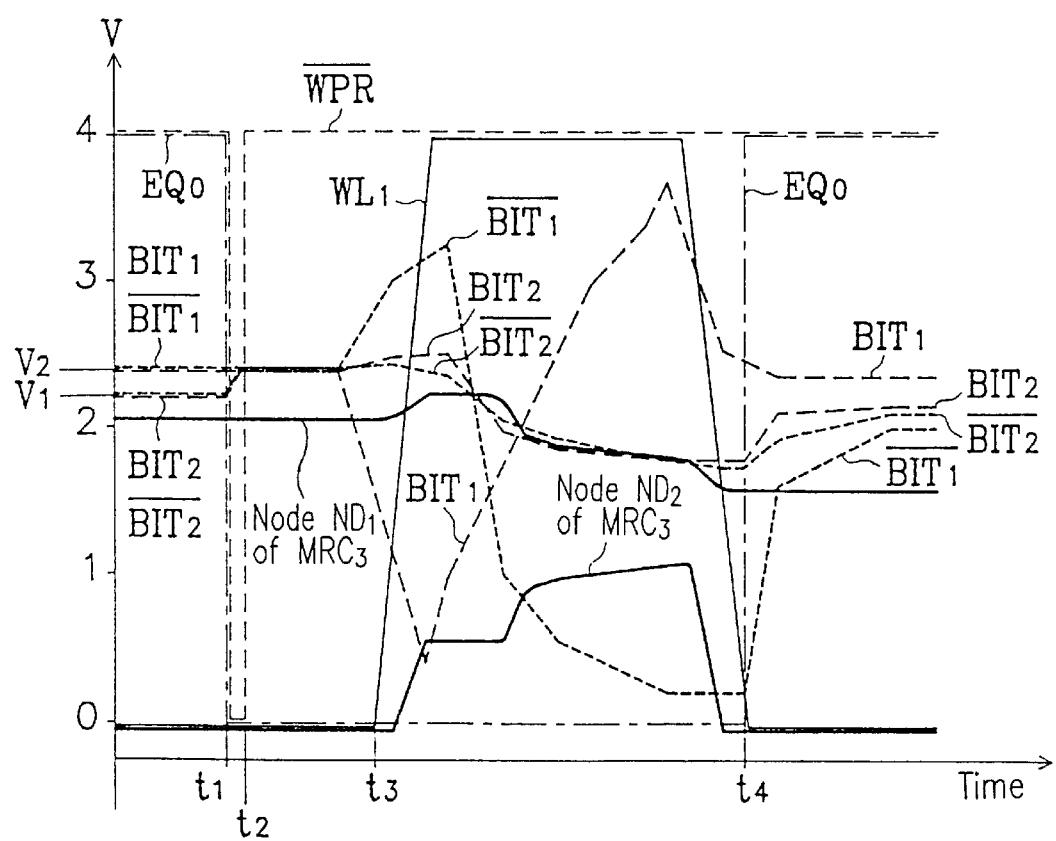
FIG. 5 is a timing diagram illustrating a write operation of the SRAM in the first example of the present invention.

For example, assume a case shown in FIG. 5. As shown in FIG. 5, when the precharging is completed at the time $t_1$ by the fall of the precharge signal $EQ_0$ to the L level, the potential on the pair of bitlines $BIT_1$ and $/BIT_1$ has reached a normal precharge level or the voltage $V_2$ (about 2.4 V), whereas the potential on the pair of bitlines $BIT_2$ and $/BIT_2$ has reached only the voltage $V_1$ (about 2.25 V) lower than the voltage $V_2$ because of the influence of the previous access. Even in such a case, since the write precharge signal /WPR falls to the L level during a short predetermined time between the times $t_1$ and $t_2$, the potential on the pair of bitlines $BIT_2$ and $/BIT_2$ can be charged by the write precharge circuit 1b to the voltage $V_2$ (about 2.4 V). Thus, even if the word line $WL_1$ rises to the H level at a time $t_3$, the potential on the bitline $/BIT_1$ once increases because of the influence of the previous access and then decreases considerably to the vicinity of 0 V and the potential on the bitline $BIT_2$ also increases slightly once and then decreases considerably, the voltage levels at internal nodes $ND_1$ and $ND_2$ of the memory cell $MRC_3$ are not inverted. As a result, even if the write operation is completed at a time $t_4$ when the word line $WL_1$ falls to the L level and the precharge signal $EQ_0$ rises again to the H level, the data stored in the memory cell $MRC_3$ is not destroyed.

Figure 6:
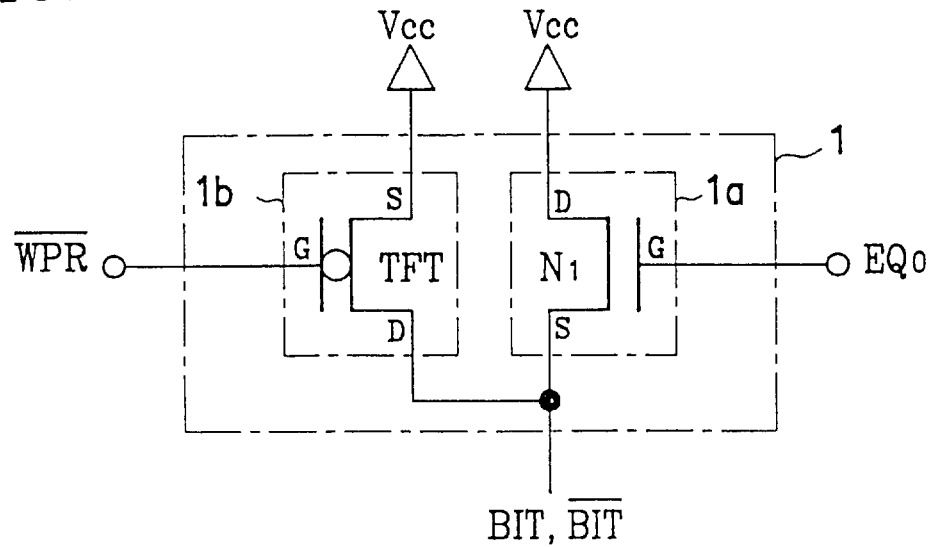
FIG. 6 is a circuit diagram showing another specific exemplary configuration of the bitline precharge circuit in the first example of the present invention.

It is noted that the write precharge circuit 1b of each bitline precharge circuit 1 is exemplified as a PMOS transistor $P_2$ shown in FIG. 3 in the foregoing description. The PMOS transistor $P_2$ is generally formed on the same semiconductor substrate on which the NMOS transistor $N_1$ constituting each precharge circuit 1a is formed. However, as shown in FIG. 6, the PMOS transistor $P_2$ may be implemented as a P-channel TFT. The TFT is a MOSFET formed by using a poly-silicon thin film or the like to be deposited as an uppermost layer on a semiconductor substrate or the like. Thus, the TFT may be formed so as to be overlapped over the uppermost layer of the NMOS transistor $N_1$ via an insulating layer so that it is possible to prevent the layout area from being increased even if the write precharge circuits 1b are provided.

Figure 7:
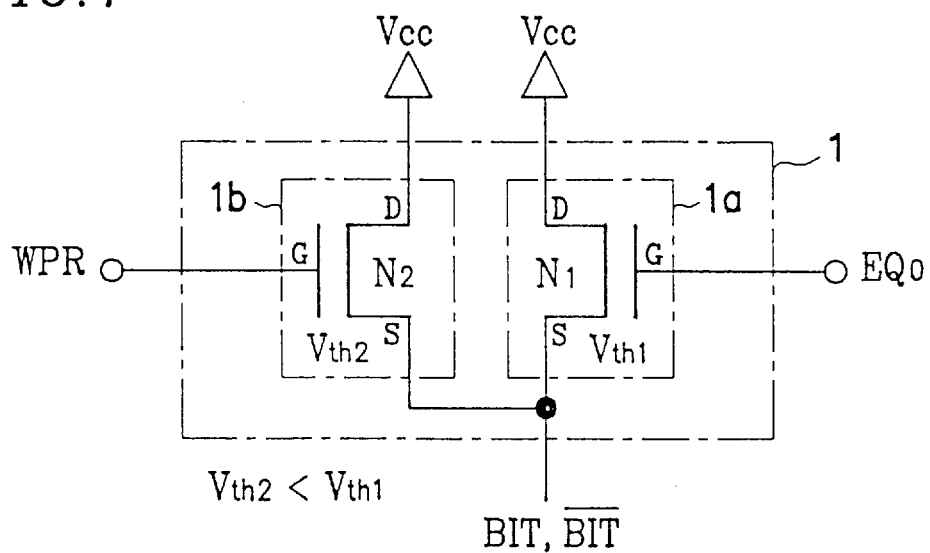
FIG. 7 is a circuit diagram showing still another specific exemplary configuration of the bitline precharge circuit in the first example of the present invention.

Furthermore, the write precharge circuit 1b may also be implemented as an NMOS transistor $N_2$ having a threshold voltage $Vth_2$ lower than the threshold voltage $Vth_1$ of the NMOS transistor $N_1$ constituting the precharge circuit 1a as shown in FIG. 7. The NMOS transistor $N_2$ is configured such that the drain D thereof is connected to the power supply $V_{cc}$, the source C is connected to the associated bitline BIT or /BIT and an "H-active" write precharge signal WPR (an "H-active" signal is regarded as having been activated when it is at an H level in accordance with a positive logic) is input to the gate G thereof. When the precharge signal $EQ_0$ rises to the H level, the bitline precharge circuit 1 charges an associated bitline BIT or /BIT to a voltage lower than the power supply voltage $V_{cc}$ by the threshold voltage $Vth_1$ via the NMOS transistor $N_1$ of the precharge circuit 1a. When the write precharge signal WPR rises to the H level (or activated) during the write operation, the bitline precharge circuit 1 charges the bitline BIT or /BIT to a voltage lower than the power supply voltage $V_{cc}$ by the threshold voltage $Vth_2$ via the NMOS transistor $N_2$ of the write precharge circuit 1b. Since the threshold voltage $Vth_2$ is lower than the threshold voltage $Vth_1$, the voltage charged by the write precharge circuit 1b becomes higher than the voltage charged by the precharge circuit 1a. Thus, the NMOS transistor $N_2$ can also function in the same way as the write precharge circuit 1b shown in FIGS. 3 and 6. Furthermore, when the write precharge circuit 1b is implemented as such a NMOS transistor $N_2$, the NMOS transistor $N_2$ has the same channel type as that of the NMOS transistor $N_1$ of the precharge circuit 1a. Thus, since these NMOS transistors $N_1$ and $N_2$ can be formed on the same well on a semiconductor substrate, it is possible to prevent the layout area from being increased because of the division of the well.

EXAMPLE 2

Figure 8:
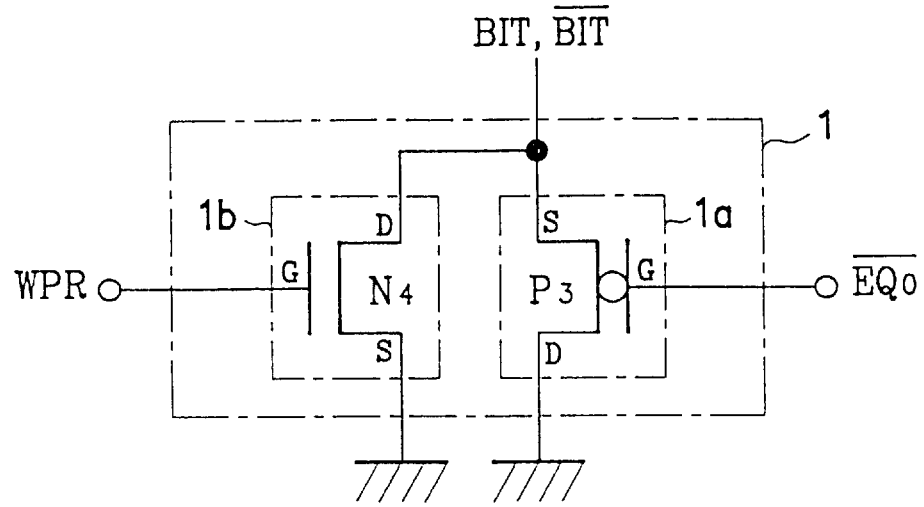
FIG. 8 is a circuit diagram showing a specific exemplary configuration of a bitline precharge circuit in the second example of the present invention.
Figure 9:
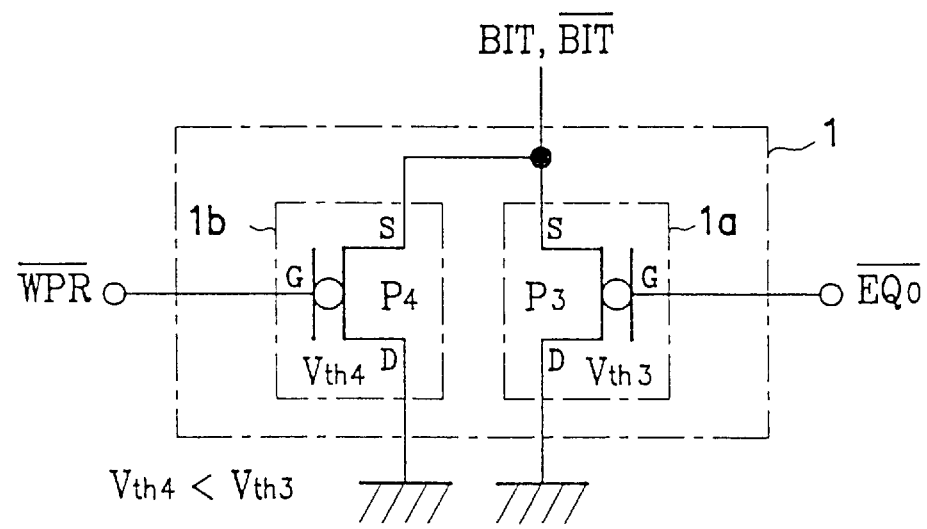
FIG. 9 is a circuit diagram showing another specific exemplary configuration of the bitline precharge circuit in the second example of the present invention.
Figure 10:
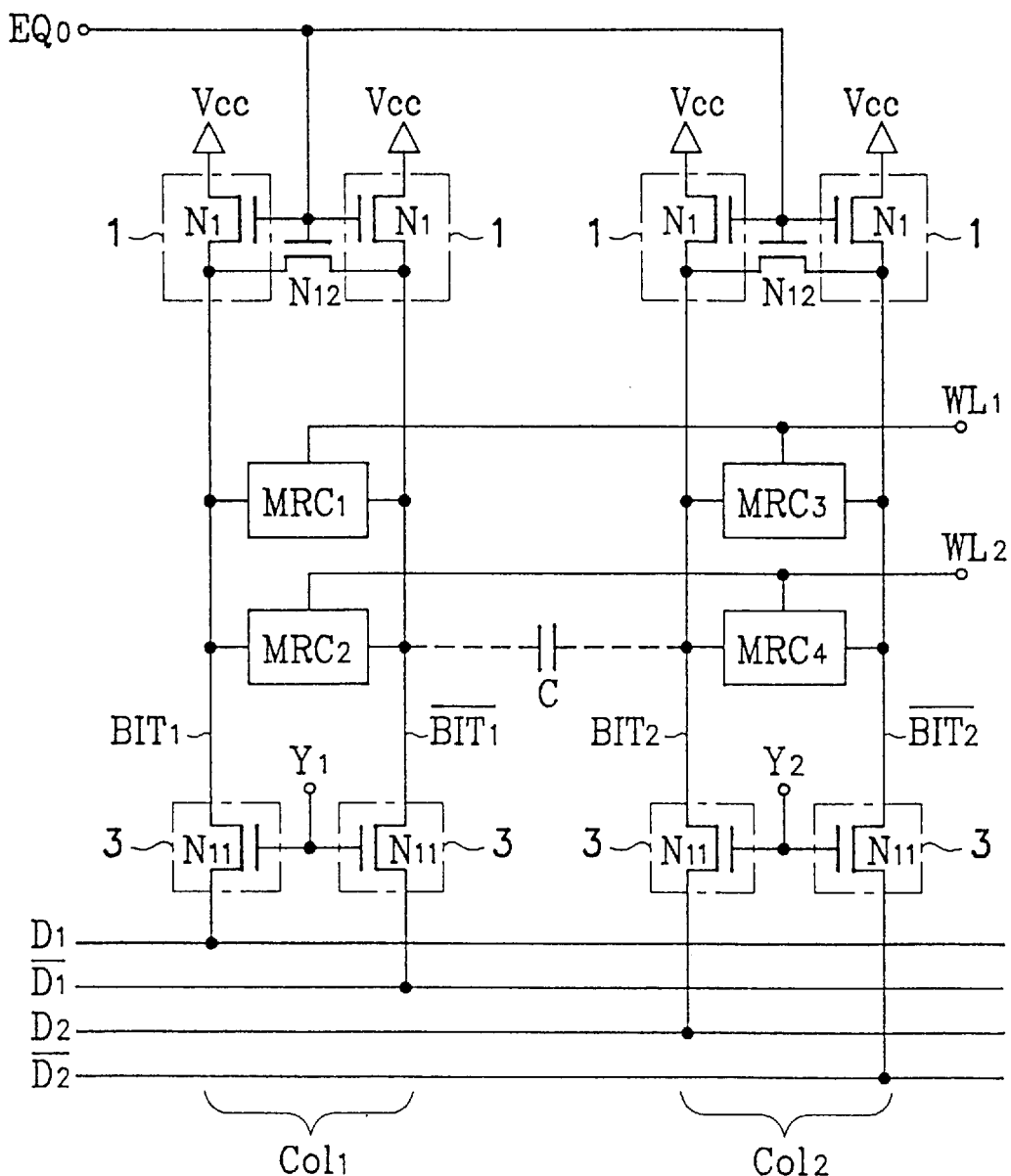
FIG. 10 is a block diagram showing a configuration of an SRAM in a conventional example.

FIGS. 8 and 9 illustrate the second example of the present invention. In FIGS. 8 and 9, the components having the same functions as those of the components of the first example shown in FIGS. 1 to 7 will be identified by the same reference numerals and the description thereof will be omitted herein.

Figure 14:
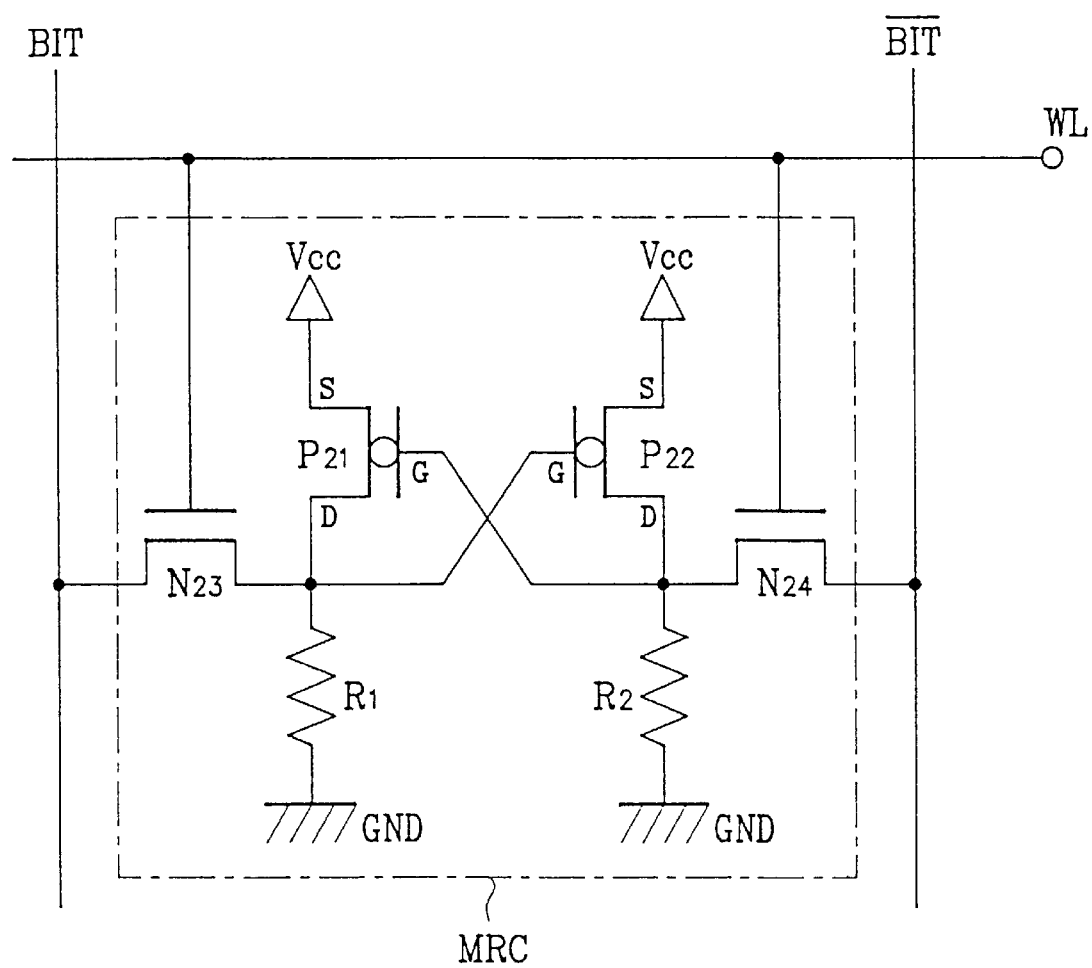
FIG. 14 is a circuit diagram showing an exemplary configuration of a conventional high-resistance pull-down type memory cell.

In this second example, a bitline precharge circuit for an SRAM including memory cells of a high-resistance pull-down type shown in FIG. 14 will be described. The SRAM of the second example has substantially the same configuration as that of the SRAM of the first example shown in FIG. 1 but is different from the SRAM of the first example in that the bitlines BIT and /BIT are connected to a ground GND via the respective bitline precharge circuits 1. That is to say, in this second example, each bitline precharge circuit 1 is configured such that the associated bitline pair BIT and /BIT are connected to the ground GND via a precharge circuit 1a and a write precharge circuit 1b, respectively.

The precharge circuit 1a is implemented as a single PMOS transistor $P_3$ in which the source S thereof is connected to the associated bitline BIT or /BIT, the drain D thereof is connected to the ground GND, and an "L-active" precharge signal $/EQ_0$ (an "L-active" signal is regarded as having been activated when it is at an L level in accordance with a negative logic) is input to the gate G thereof. Thus, when the precharge signal $/EQ_0$ falls to the L level (or activated) during the precharge period before a write operation or a read operation is performed, the PMOS transistor $P_3$ is turned ON so that the associated bitline BIT or /BIT is connected to the ground GND. It is noted that, in this case, the potential on the bitline BIT or /BIT is discharged to the precharge level higher than the voltage of the ground GND by the threshold voltage Vth of the PMOS transistor $P_3$. Also, when the precharge signal $/EQ_0$ falls to the L level, each pair of bitlines BIT and /BIT on each column Col are connected to each other via a MOS transistor (not shown) so that the voltages on these bitlines are equalized.

The write precharge circuit 1b is a circuit which can charge the associated bitline BIT or /BIT to a voltage lower than that of the precharge circuit 1a when a write precharge signal WPR is activated, and may be implemented as a single NMOS transistor $N_4$ as shown in FIG. 8 in which the drain D thereof is connected to the associated bitline BIT or /BIT, the source S thereof is connected to the ground GND and an "H-active" write precharge signal WPR is input to the gate G thereof.

Thus, in the case of the write operation, when the write precharge signal WPR rises to the H level (or activated) during the predetermined period after the precharge signal $/EQ_0$ has risen to the H level (or deactivated) and before the write operation is performed, the NMOS transistor $N_4$ is turned ON so that the associated bitline BIT or /BIT is connected to the ground GND. Furthermore, in this case, since the NMOS transistor $N_4$ can hold the ON state irrespective of the potential on the bitlines BIT and /BIT, the potential on the bitlines BIT and /BIT can be discharged down to the voltage of the ground GND.

However, it takes a rather long time to discharge the bitlines BIT and /BIT in accordance with the current drivability of the NMOS transistor $N_4$ and the like. Thus, by adjusting the length of the predetermined period during which the write precharge signal WPR holds the H level, the potential on the bitlines BIT and /BIT is charged to a voltage which is surely lower than the voltage charged during the precharge period but sufficiently higher than the voltage of the ground GND.

Under the above-described configuration, in the SRAM of the second example, the bitline precharge circuit 1 turns ON only the PMOS transistor $P_3$ of the precharge circuit 1a, thereby charging the bitlines BIT and /BIT to a normal precharge level during a read operation. In addition, since the bitlines BIT and /BIT are not greatly affected by the coupling caused by the parasitic capacitance C, the data stored in a memory cell MRC can be read out rapidly and surely.

On the other hand, in the case of a write operation, the potential on an adjacent non-selected bitline BIT or /BIT is varied because of the coupling caused by the parasitic capacitance C. Furthermore, since the memory cell MRC of this example is of a high-resistance pull-down type shown in FIG. 14, if the potential on the non-selected bitline BIT or /BIT increases because of the coupling, then the data stored in the memory cell MRC on the non-selected bitline BIT or /BIT is more likely to be destroyed. However, the bitline precharge circuit 1 of the second example turns ON the PMOS transistor $P_3$ of the precharge circuit 1a before the write operation is started, charges the associated bitline BIT or /BIT to the precharge level and then turns ON the NMOS transistor $N_4$ of the write precharge circuit 1b, thereby further varying the potential on the bitline BIT or /BIT into a voltage lower than the precharge level by a predetermined level. Thus, even when the potential on the adjacent non-selected bitline BIT or /BIT increases because of the coupling caused by the parasitic capacitance C, this potential variation is caused at a voltage level lower than a conventional level so that it is possible to prevent the data stored in a non-selected memory cell MRC from being destroyed.

It is noted that the write precharge circuit 1b of the bitline precharge circuit 1 is exemplified as an NMOS transistor $N_4$ shown in FIG. 8 in the foregoing description. However, as shown in FIG. 9, the write precharge circuit 1b may also be implemented as a PMOS transistor $P_4$ having a threshold voltage $Vth_4$ lower than the threshold voltage $Vth_3$ of the PMOS transistor $P_3$ of the precharge circuit 1a. The PMOS transistor $P_4$ is configured such that the source S thereof is connected to the associated bitline BIT or /BIT, the drain D is connected to the ground GND and an "L-active" write precharge signal /WPR is input to the gate G thereof.

When the precharge signal $/EQ_0$ falls to the L level, the bitline precharge circuit 1 discharges the associated bitline BIT or /BIT to a voltage higher than the voltage of the ground GND by the threshold voltage $Vth_3$ via the PMOS transistor $P_3$ of the precharge circuit 1a. When the write precharge signal /WPR falls to the L level (or activated) during the write operation, the bitline precharge circuit 1 discharges the bitline BIT or /BIT to a voltage higher than the voltage of the ground GND by the threshold voltage $Vth_4$ via the PMOS transistor $P_4$ of the write precharge circuit 1b. Since the threshold voltage $Vth_4$ is lower than the threshold voltage $Vth_3$, the voltage charged by the write precharge circuit 1b becomes lower than the voltage charged by the precharge circuit 1a. Thus, the PMOS transistor $P_4$ can also function in the same way as the write precharge circuit 1b shown in FIG. 8. Furthermore, when the write precharge circuit 1b is implemented as such a PMOS transistor $P_4$, the PMOS transistor $P_4$ has the same channel type as that of the PMOS transistor $P_3$ of the precharge circuit 1a. Thus, since these PMOS transistors $P_3$ and $P_4$ can be formed on the same well on a semiconductor substrate, it is possible to prevent the layout area from being increased because of the division of the well.

Moreover, in the second example, the NMOS transistor $N_4$ of the write precharge circuit 1b shown in FIG. 8 may also be implemented as a TFT.

In the first and the second examples, the present invention has been described as being implemented as a bitline precharge circuit 1 for an SRAM. However, the present invention is also applicable to bitline precharge circuits for various other semiconductor memory devices having similar problems to be solved.

As is apparent from the foregoing description, in the bitline precharge circuit for a semiconductor memory device according to the present invention, even in the case where the potential on a non-selected bitline has been varied because of an electrostatic induction from a bitline selected during a write operation, the potential variation can be compensated for beforehand by a write precharge circuit, thereby preventing the data stored in a memory cell connected to the non-selected bitline from being destroyed.

In this case, if an SRAM memory cell of such a high-resistance pull-up type is used in which the data stored therein is likely to be destroyed by the decrease of the bitline potential, the write precharge circuit further varies the potential on the bitline into a level higher than the precharge level by a predetermined level, thereby offsetting the potential variation of the bitline to a lower voltage and protecting the data stored in a non-selected memory cell. On the other hand, if an SRAM memory cell of such a high-resistance pull-down type is used in which the data stored therein is likely to be destroyed by the increase of the bitline potential, the write precharge circuit further varies the potential on the bitline into a level lower than the precharge level by a predetermined level, thereby offsetting the potential variation of the bitline to a higher voltage and protecting the data stored in the non-selected memory cell.

Furthermore, if a PMOS transistor for a write precharge circuit is implemented as a TFT formed on the NMOS transistor of the precharge circuit, it is possible to prevent the layout area from being increased. Moreover, if the MOS transistor of the write precharge circuit has the same channel type as that of the MOS transistor of the precharge circuit, then these MOS transistors can be formed on the same well. Thus, it is possible to prevent the layout area from being increased because of the division of the well.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A bitline precharge circuit for a semiconductor memory device, the semiconductor memory device comprising:
   a plurality of word lines arranged in a row direction;
   a plurality of bitlines forming a plurality of bitline pairs which are arranged in a column direction; and
   a plurality of memory cells connected between each of the plurality of bitline pairs via a plurality of switching elements, the switching elements being controlled by respectively different ones of the word lines,
   the bitline precharge circuit charging a potential on all of the bitlines to a precharge level which is approximately intermediate between a power supply voltage and a ground voltage before a write operation or a read operation is performed,
   wherein the bitline precharge circuit comprises a write precharge circuit for varying the potential on the bitlines by a predetermined level before the write operation is performed and after the potential on the bitlines has been charged to the precharge level.

2. A bitline precharge circuit for a semiconductor memory device according to claim 1, wherein the write precharge circuit further varies the potential on the bitlines, which has been charged to the precharge level, to a higher potential by the predetermined level.

3. A bitline precharge circuit for a semiconductor memory device according to claim 1, wherein the write precharge circuit further varies the potential on the bitlines, which has been charged to the precharge level, to a Lower potential by the predetermined level.

4. A bitline precharge circuit for a semiconductor memory device according to claim 2, wherein each of the memory cell is an SRAM memory cell of a high-resistance pull-up type which includes a first and a second NMOS transistor and in which drains of the first and second NMOS transistors are connected to a power supply via respective high resistances, sources of the first and second NMOS transistors are grounded and gates of the first and second NMOS transistors are connected to the drain of the second NMOS transistor and the drain of the first NMOS transistor, respectively.

5. A bitline precharge circuit for a semiconductor memory device according to claim 3, wherein each of the memory cell is an SRAM memory cell of a high-resistance pull-down type which includes a first and a second PMOS transistor and in which sources of the first and second PMOS transistors are connected to a power supply, drains of the first and second PMOS transistors are grounded via respective high resistances and gates of the first and second PMOS transistors are connected to the drain of the second PMOS transistor and the drain of the first PMOS transistor, respectively.

6. A bitline precharge circuit for a semiconductor memory device according to claim 2, wherein the precharge circuit comprises an NMOS transistor associated with each of the bitlines and is configured such that a drain of the NMOS transistor is connected to a power supply, a source of the NMOS transistor is connected to the associated bitline and a precharge signal rising to an H level during a precharge period is input to a gate of the NMOS transistor,
   and wherein the write precharge circuit comprises a PMOS transistor associated with each of the bitlines and is configured such that a source of the PMOS transistor is connected to a power supply, a drain of the PMOS transistor is connected to the associated bitline and a write precharge signal, falling to an L level during a predetermined period immediately before the write operation and after the precharge period, is input to a gate of the PMOS transistor.

7. A bitline precharge circuit for a semiconductor memory device according to claim 4, wherein the precharge circuit comprises an NMOS transistor associated with each of the bitlines and is configured such that a drain of the NMOS transistor is connected to a power supply, a source of the NMOS transistor is connected to the associated bitline and a precharge signal rising to an H level during a precharge period is input to a gate of the NMOS transistor,
   and wherein the write precharge circuit comprises a PMOS transistor associated with each of the bitlines and is configured such that a source of the PMOS transistor is connected to a power supply, a drain of the PMOS transistor is connected to the associated bitline and a write precharge signal, falling to an L level during a predetermined period immediately before the write operation and after the precharge period, is input to a gate of the PMOS transistor.

8. A bitline precharge circuit for a semiconductor memory device according to claim 6, wherein the PMOS transistor of the write precharge circuit is constituted by a TFT.

9. A bitline precharge circuit for a semiconductor memory device according to claim 7, wherein the PMOS transistor of the write precharge circuit is constituted by a TFT.

10. A bitline precharge circuit for a semiconductor memory device according to claim 2, wherein the precharge circuit comprises a first NMOS transistor associated with each of the bitlines and is configured such that a drain of the first NMOS transistor is connected to a power supply, a source of the first NMOS transistor is connected to the associated bitline and a precharge signal rising to an H level during a precharge period is input to a gate of the first NMOS transistor,
   and wherein the write precharge circuit comprises a second NMOS transistor, which is associated with each of the bitlines and has a threshold voltage lower than a threshold voltage of the first NMOS transistor, and is configured such that a drain of the second NMOS transistor is connected to a power supply, a source of the second NMOS transistor is connected to the associated bitline and a write precharge signal, rising to the H level during a predetermined period immediately before the write operation and after the precharge period, is input to a gate of the second NMOS transistor.

11. A bitline precharge circuit for a semiconductor memory device according to claim 4, wherein the precharge circuit comprises a first NMOS transistor associated with each of the bitlines and is configured such that a drain of the first NMOS transistor is connected to a power supply, a source of the first NMOS transistor is connected to the associated bitline and a precharge signal rising to an H level during a precharge period is input to a gate of the first NMOS transistor, and wherein the write precharge circuit comprises a second NMOS transistor, which is associated with each of the bitlines and has a threshold voltage lower than a threshold voltage of the first NMOS transistor, and is configured such that a drain of the second NMOS transistor is connected to a power supply, a source of the second NMOS transistor is connected to the associated bitline and a write precharge signal, rising to the H level during a predetermined period immediately before the write operation and after the precharge period, is input to a gate of the second NMOS transistor.

12. A bitline precharge circuit for a semiconductor memory device according to claim 3, wherein the precharge circuit comprises a PMOS transistor associated with each of the bitlines and is configured such that a source of the PMOS transistor is connected to the associated bitline, a drain of the PMOS transistor is grounded and a precharge signal falling to an L level during a precharge period is input to a gate of the PMOS transistor, and wherein the write precharge circuit comprises an NMOS transistor associated with each of the bitlines and is configured such that a drain of the NMOS transistor is connected to the associated bitline, a source of the NMOS transistor is grounded and a write precharge signal, rising to the H level during a predetermined period immediately before the write operation and after the precharge period, is input to a gate of the NMOS transistor.

13. A bitline precharge circuit for a semiconductor memory device according to claim 5, wherein the precharge circuit comprises a PMOS transistor associated with each of the bitlines and is configured such that a source of the PMOS transistor is connected to the associated bitline, a drain of the PMOS transistor is grounded and a precharge signal falling to an L level during a precharge period is input to a gate of the PMOS transistor, and wherein the write precharge circuit comprises an NMOS transistor associated with each of the bitlines and is configured such that a drain of the NMOS transistor is connected to the associated bitline, a source of the NMOS transistor is grounded and a write precharge signal, rising to the H level during a predetermined period immediately before the write operation and after the precharge period, is input to a gate of the NMOS transistor.

14. A bitline precharge circuit for a semiconductor memory device according to claim 3, wherein the precharge circuit comprises a first PMOS transistor associated with each of the bitlines and is configured such that a source of the first PMOS transistor is connected to the associated bitline, a drain of the first PMOS transistor is grounded, and a precharge signal falling to an L level during a precharge period is input to a gate of the first PMOS transistor, and wherein the write precharge circuit comprises a second PMOS transistor, which is associated with each of the bitlines and has a threshold voltage lower than a threshold voltage of the first PMOS transistor, and is configured such that a source of the second PMOS transistor is connected to the associated bitline, a drain of the second PMOS transistor is grounded, and a write precharge signal, falling to the L level during a predetermined period immediately before the write operation and after the precharge period, is input to a gate of the second PMOS transistor.

15. A bitline precharge circuit for a semiconductor memory device according to claim 5, wherein the precharge circuit comprises a first PMOS transistor associated with each of the bitlines and is configured such that a source of the first PMOS transistor is connected to the associated bitline, a drain of the first PMOS transistor is grounded, and a precharge signal falling to an L level during a precharge period is input to a gate of the first PMOS transistor, and wherein the write precharge circuit comprises a second PMOS transistor, which is associated with each of the bitlines and has a threshold voltage lower than a threshold voltage of the first PMOS transistor, and is configured such that a source of the second PMOS transistor is connected to the associated bitline, a drain of the second PMOS transistor is grounded, and a write precharge signal, falling to the L level during a predetermined period immediately before the write operation and after the precharge period, is input to a gate of the second PMOS transistor.

16. A bitline precharge circuit for a semiconductor memory device according to claim 12, wherein the NMOS transistor of the write precharge circuit is constituted by a TFT.

17. A bitline precharge circuit for a semiconductor memory device according to claim 13, wherein the NMOS transistor of the write precharge circuit is constituted by a TFT.

* * * * *